United States Patent
Tong et al.

(10) Patent No.: US 7,971,114 B2
(45) Date of Patent: Jun. 28, 2011

(54) METHOD FOR TESTING A MEMORY DEVICE

(75) Inventors: Mo-Ying Tong, Shenzhen (CN); Xue-Wen Hong, Shenzhen (CN); Chiang-Chung Tang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 83 days.

(21) Appl. No.: 12/504,808

(22) Filed: Jul. 17, 2009

(65) Prior Publication Data

US 2010/0211835 A1    Aug. 19, 2010

(30) Foreign Application Priority Data

Feb. 19, 2009    (CN) .......................... 2009 1 0300486

(51) Int. Cl.
*G11C 29/00*    (2006.01)

(52) U.S. Cl. .......................... 714/720; 714/718; 714/719

(58) Field of Classification Search .................. 714/720, 714/719, 718, 819; 365/200, 201
See application file for complete search history.

(56) References Cited

U.S. PATENT DOCUMENTS

| | | | | |
|---|---|---|---|---|
| 4,622,668 A * | 11/1986 | Dancker et al. | ................. | 714/42 |
| 5,299,202 A * | 3/1994 | Vaillancourt | ................... | 714/42 |
| 5,689,466 A * | 11/1997 | Qureshi | ......................... | 365/201 |
| 7,246,277 B2 * | 7/2007 | Lukanc | ......................... | 714/718 |
| 7,325,176 B2 * | 1/2008 | Larson et al. | ................. | 714/718 |

\* cited by examiner

*Primary Examiner* — Phung M Chung
(74) *Attorney, Agent, or Firm* — Raymond J. Chew (57) ABSTRACT

A method for testing a random-access memory (RAM) includes six tests. The first test is performed by performing a write and read test to storage locations of the RAM. The second test is performed by testing walking 1's across each data bus of the RAM. The third test is performed by testing walking 0's across the data bus of the RAM. The fourth test is performed by testing walking 1's across each address bus of the RAM. The fifth test is performed by testing walking 0's across the address bus bit of the RAM. The sixth test is performed by performing a write and read test to random blocks in the storage locations of the RAM.

20 Claims, 6 Drawing Sheets

METHOD FOR TESTING A MEMORY DEVICE

BACKGROUND

1. Technical Field

Embodiments of the present disclosure generally relate to systems and methods for testing components of an electronic device, and more particularly to a system and method for testing a memory device of the electronic device.

2. Description of Related Art

Memory devices, such as a random access memory (RAM), is often used to store data for a computer so that the data can be quickly fetched by a processor of the computer. Proper functioning of memory devices is critical to computer performance. As such, memory devices must be properly and effectively tested.

Usually, memory devices are tested by utilizing hardware equipments. One problem of this method is that the hardware equipments need to be extra bought. As a result, test cost increases.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
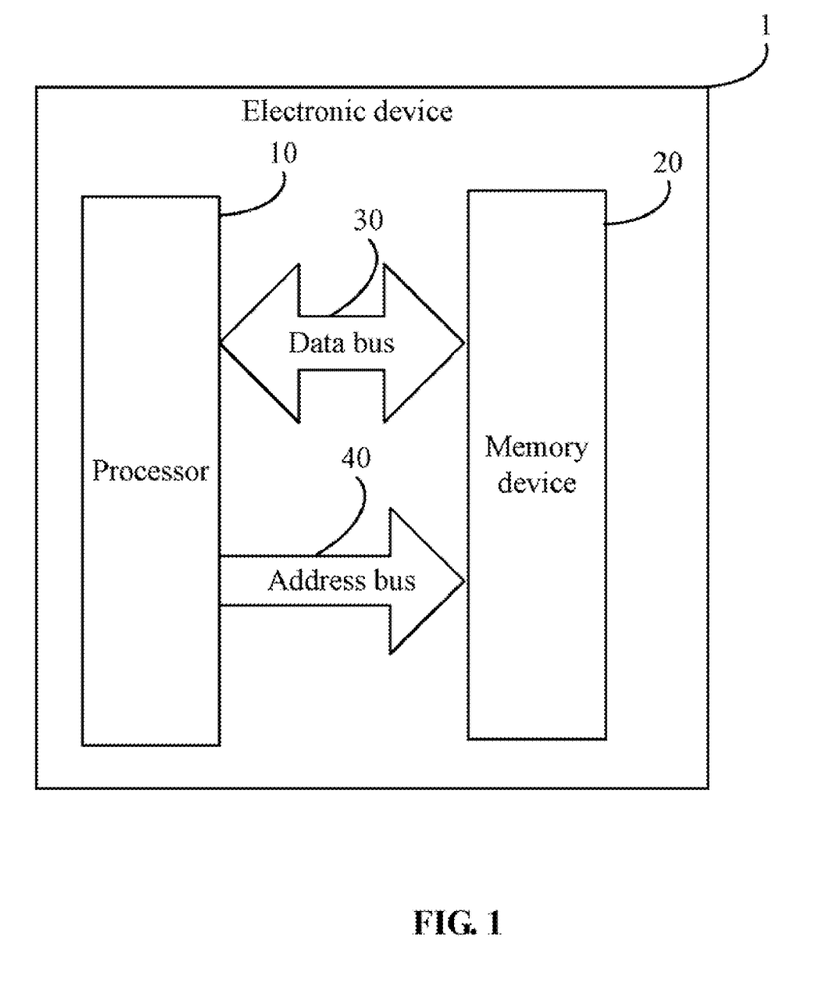
FIG. 1 is a block diagram of one embodiment of an electronic device for testing a memory device.

FIG. 1 is a block diagram of one embodiment of an electronic device 1. The electronic device 1 can test a memory device 20 included therein. The electronic device 1 may be a computer, a mobile phone, a person digital assistant (PDA), for example. The memory device 20 may be, such as a random access memory (RAM), a read only memory (ROM), a cache. The following description takes a RAM 20 as an example. The electronic device 1 further includes a processor 10. The processor 10 can write and/or read values to/from the memory device 20 via a data bus (DB) 30 and an address bus (AD) 40.

Figure 2:
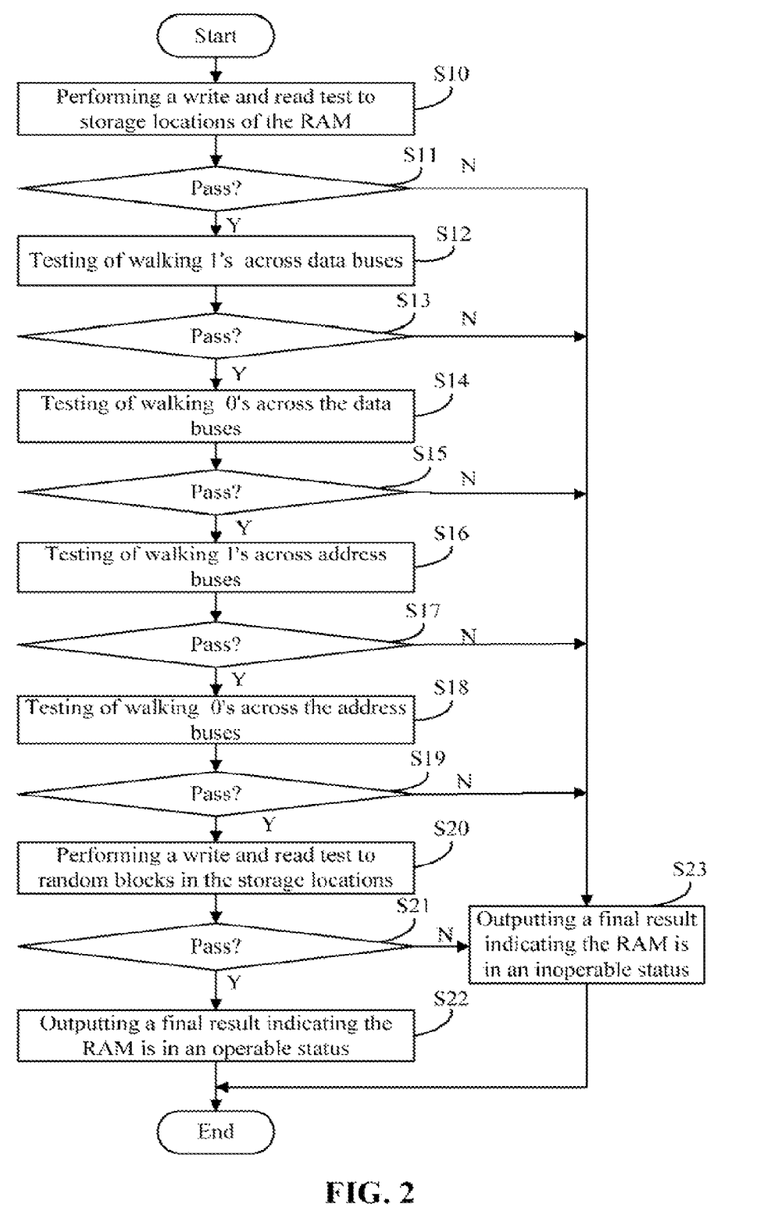
FIG. 2 is a flowchart illustrating one embodiment of a method for testing a memory device.

FIG. 2 is a flowchart illustrating one embodiment of a method for testing the RAM 20. Depending on the embodiment, additional blocks in the flow of FIG. 2 may be added, others removed, and the ordering of the blocks may be changed.

In block S10, a first test for the RAM 20 is performed by performing a write and read test to storage locations of the RAM 20. A detailed description of the first test will be given below referring to FIG. 3.

In block S11, a determination is made as to whether the RAM 20 passes the first test according to a first test result. In one embodiment, if the RAM 20 passes the first test, the flow goes to block S12. In another embodiment, if the RAM 20 fails the first test, the flow goes to block S23 described below.

In block S12, a second test for the RAM 20 is performed by testing walking 1's across the data bus 30 for confirming that any value placed on the data bus 30 by the processor 10 is correctly received by the RAM 20. It may be understood that, walking 1's is a memory test that involves moving a 1 bit through a byte or word to systematically confirm each bit can hold a 1 value. All of the other bits are set to 0 during the test. A detail description of the second test will be given below referring to FIG. 4.

In block S13, a determination is made as to whether the RAM 20 passes the second test according to a second test result. In one embodiment, if the RAM 20 passes the second test, the flow goes to block S14. In another embodiment, if the RAM 20 fails the second test, the flow goes to block S23 described below.

In block S14, a third test for the RAM 20 is performed by testing walking 0's across the data bus 30. Walking 0's is memory test that involves moving a 0 bit through a byte or word to systematically confirm each bit can hold a 0 value. All of the other bits are set to 1 during the test. A detail description of the third test will be given below referring to FIG. 4.

In block S15, a determination is made as to whether the RAM 20 passes the third test according to a third test result. In one embodiment, if the RAM 20 passes the third test, the flow goes to block S16. In another embodiment, if the RAM 20 fails the third test, the flow goes to block S23 described below.

In block S16, a fourth test for the RAM 20 is performed by testing walking 1's across the address bus 40 to confirm that no two memory locations overlap. A detail description of the fourth test will be given below referring to FIG. 5.

In block S17, a determination is made as to whether the RAM 20 passes the fourth test according to a fourth test result. In one embodiment, if the RAM 20 passes the fourth test, the flow goes to block S18. In another embodiment, if the RAM 20 fails the fourth test, the flow goes to block S23 described below.

In block S18, a fifth test for the RAM 20 is performed by testing walking 0's across the address bus 40. A detail description of the fifth test will be given below referring to FIG. 5.

In block S19, a determination is made as to whether the RAM 20 passes the fifth test according to a fifth test result. In one embodiment, if the RAM 20 passes the fifth test, the flow goes to block S20. In another embodiment, if the RAM 20 fails the fifth test, the flow goes to block S23 described below.

In block S20, a sixth test for the RAM 20 is performed by performing a write and read test to random blocks in the storage locations of the RAM 20. A detail description of the sixth test will be given below referring to FIG. 6.

In block S21, a determination is made as to whether the RAM 20 passes the sixth test according to a sixth test result. In one embodiment, if the RAM 20 passes the sixth test, the flow goes to block S22. In another embodiment, if the RAM 20 fails the sixth test, the flow goes to block S23.

In block S22, a final result indicating the RAM 20 is in an operable status is outputted to a display screen of the electronic device 1. Otherwise, in block S23, the final result indicating the RAM 20 is in an inoperable status is outputted to the display screen of the electronic device 1.

Figure 3:
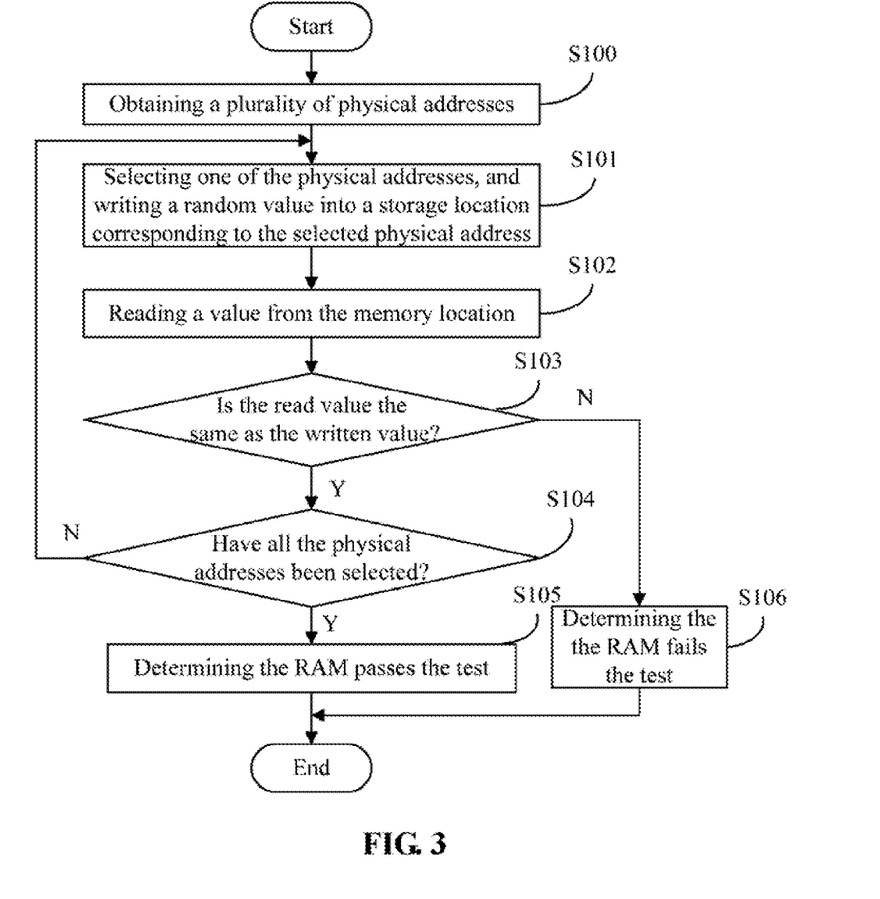
FIG. 3 is a flowchart illustrating one embodiment of a method detailing block S10 of FIG. 2.

FIG. 3 is a flowchart illustrating one embodiment of a method detailing block S10 of FIG. 2, that is the first test for the RAM 20. Depending on the embodiment, additional blocks in the flow of FIG. 3 may be added, others removed, and the ordering of the blocks may be changed.

In block S100, a plurality of physical addresses of the RAM 20 are obtained. In one embodiment, storage locations corresponding to the plurality of physical addresses may be empty.

In block S101, one of the physical addresses is selected randomly, and a random value is written into a storage location corresponding to the selected physical address of the RAM 20. In one embodiment, a bit width of the random value is the same with a word length of the processor 10.

In block S102, a value is read from the storage location corresponding to the selected physical address.

In block S103, a comparison is made as to whether the read value is the same as the written value. If the read value is the same as the written value, the flow goes to block S104. Otherwise, if the read value is not the same as the written value, the flow goes to block S106 described below.

In block S104, a determination is made as to whether all the obtained physical addresses of the RAM 20 have been selected. If at least one of the physical addresses has not been selected, the flow returns to block S101 described above. Otherwise, if all the physical addresses have been selected, the flow goes to block S105.

In block S105, the first test result is made as to the RAM 20 passes the first test.

In block S103, if the read value is not the same as the written value, then, in block S106, the first test result is made as to the RAM 20 fails the first test.

Figure 4:
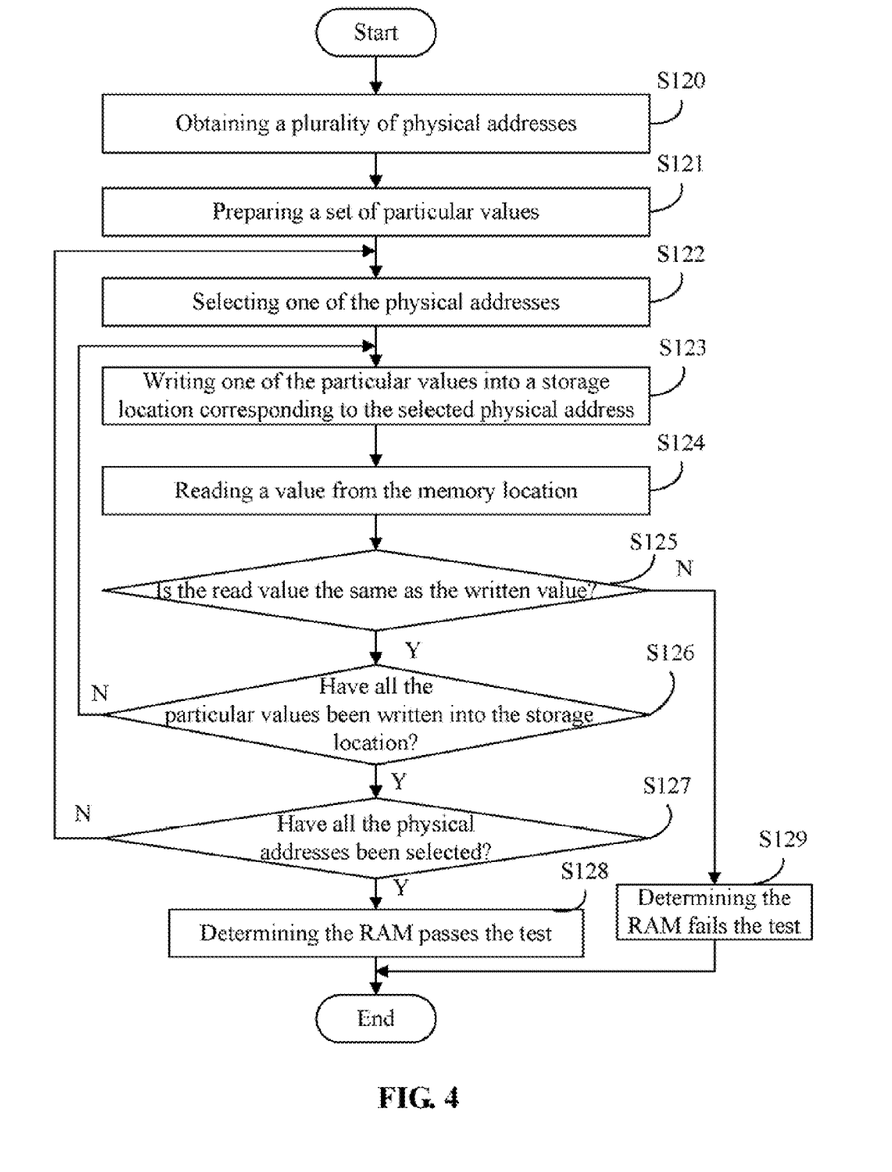
FIG. 4 is a flowchart illustrating one embodiment of a method detailing blocks S12 and S14 of FIG. 2.

FIG. 4 is a flowchart illustrating one embodiment of a method detailing block S12 of FIG. 2, that is the second test for the RAM 20. Depending on the embodiment, additional blocks in the flow of FIG. 4 may be added, others removed, and the ordering of the blocks may be changed.

In block S120, a plurality of physical addresses of the RAM 20 are obtained. In one embodiment, storage locations corresponding to the plurality of the physical addresses may be empty. In one embodiment, the plurality of physical addresses are the physical addresses obtained in block S100 of FIG. 3.

In block S121, a set of first particular values are prepared. In one embodiment, a count of the set of the first particular values and a bit width of each first particular value are equal to a word length of the processor 10. For example, if the processor 10 is 8-bit, the set consists of eight first particular values, and the bit width of each first particular value is 8 bits. In addition, only one bit of each first particular value is set to "1", all other bits are set to "0." Furthermore, all of the first particular values are different from each other. For example, the first particular values may respectively be: "10000000," "01000000,""00100000," "00010000," "00001000," "00000100," "00000010," and "00000001."

In block S122, one of the obtained physical addresses is selected randomly.

In block S123, any one of the first particular values is written into a storage location corresponding to the selected physical address of the RAM 20.

In block S124, a value is read from the storage location corresponding to the selected physical address.

In block S125, a comparison is made as to whether the read value is the same as the written value. If the read value is the same as the written value, the flow goes to block S126. Otherwise, if the read value is not the same as the written value, the flow goes to block S129 described below.

In block S126, a determination is made as to whether all the first particular values have been written into the storage location corresponding to the selected physical address. If all the first particular values have been written into the storage location, the flow goes to block S127. Otherwise, if at least one of the first particular values has not been written into the storage location, the flow returns to block S123 described above.

In block S127, one more determination is made as to whether all the obtained physical addresses have been selected. If all the obtained physical addresses have been selected, the flow goes to block S128. Otherwise, if at least one of the obtained physical addresses has not been selected, the flow returns to block S122 described above.

In block S128, the second test result is made as to the RAM 20 passes the second test.

In block S125, if the read value is not same as the written value, then, in block S129, the second test result is made as to the RAM 20 fails the second test.

FIG. 4 is also a flowchart illustrating one embodiment of a method detailing block S14 of FIG. 2, that is the third test for the RAM 20. For a concise description of the disclosure, a process of the third test for the RAM 20 is not described again. However, in the process of the third test for the RAM 20, a set of second particular values are prepared. In one embodiment, a count of the set of the second particular values and a bit width of each second particular value are equal to a word length of the processor 10. In addition, only one bit of each second particular value is set to "0", all other bits are set to "1." Furthermore, all of the second particular values are different from each other. For example, the second particular values may respectively be: "01111111," "10111111" "11011111,""11101111," "11110111," "111111011," "11111101," and "11111110."

Figure 5:
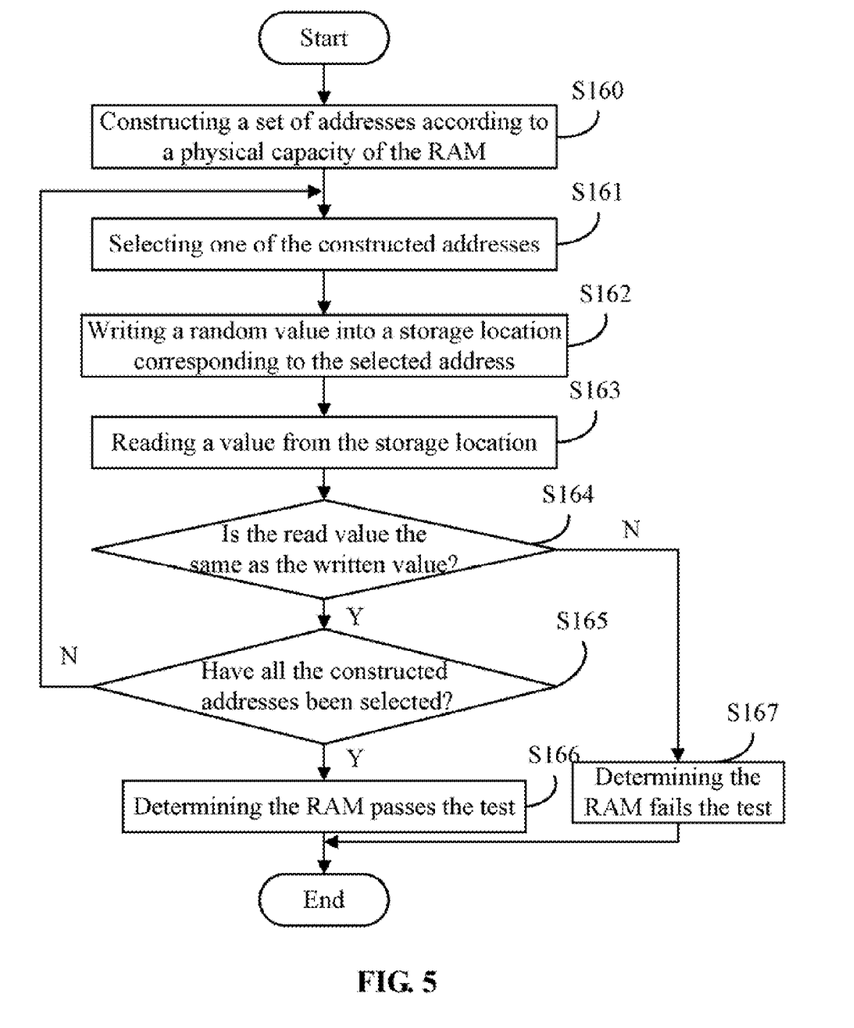
FIG. 5 is a flowchart illustrating one embodiment of a method detailing blocks S16 and S18 of FIG. 2.

FIG. 5 is a flowchart illustrating one embodiment of a method detailing block S16 of FIG. 2, that is the fourth test for the RAM 20. Depending on the embodiment, additional blocks in the flow of FIG. 5 may be added, others removed, and the ordering of the blocks may be changed.

In block S160, a set of first memory addresses of the RAM 20 are constructed according to a physical capacity of the RAM 20. For example, if the physical capacity of the RAM 20 is $2^8$ GB, a count of the first constructed addresses is 8. The first constructed addresses may be in binary format. The binary format, in one embodiment, may include setting only one bit of each first constructed addresses to be "1" and setting all other bits to be "0." In addition, "1" is being shifted from the first bit to the "nth" bit of the first constructed addresses. The "n" is equal to the count of the first constructed addresses. For example, if the first constructed addresses are 10 bits, and the count of the first constructed addresses is 8, then, the first constructed addresses are respectively: "1000000000," "0100000000," "0010000000," "0001000000," "0000100000,""0000010000," "0000001000," and "0000000100."

In block S161, any one of the first constructed addresses is selected.

In block S162, a random value is written into a storage location corresponding to the selected first constructed address. In one embodiment, a bit width of the value is the same with a word length of the processor 10.

In block S163, a value is read from the storage location corresponding to the selected first constructed address.

In block S164, a comparison is made as to whether the read value is the same as the written value. If the read value is the same as the written value, the flow goes to block S165. Otherwise, if the read value is not same as the written value, the flow goes to block S167 described below.

In block S165, a determination is made as to whether all the first constructed addresses have been selected. If all the first constructed addresses have been selected, the flow goes to block S166. Otherwise, if at least one of the first constructed addresses has not been selected, the flow returns to block S161 described above.

In block S166, the fourth test result is made as to the RAM 20 passes fourth test.

In block S164, if the read value is not the same as the written value, then, in block S167, the fourth test result is made as to the RAM 20 fails the fourth test.

FIG. 5 is also a flowchart illustrating one embodiment of a method detailing block S18 of FIG. 2, that is the fifth test for the RAM 20. For a concise description of the disclosure, a process of the fifth test for the RAM 20 is not described again. However, in the process of the fifth test for the RAM 20, a set of second memory addresses of the RAM 20 are constructed according to the physical capacity of the RAM 20. The binary format of the second constructed addresses, in one embodiment, may include setting only one bit of each second constructed addresses to be "0" and setting all other bits to be "1." In addition, "0" is being shifted from the first bit to the "nth" bit of the second constructed addresses, wherein "n" is equal to the count of the second constructed addresses. For example, if the second constructed addresses are 10 bits, and the count of the second constructed addresses is 8, then, the first constructed addresses are respectively: "0111111111," "1011111111," "1101111111," "1110111111," "1111011111," "1111101111," "1111110111," and "1111111011."

Figure 6:
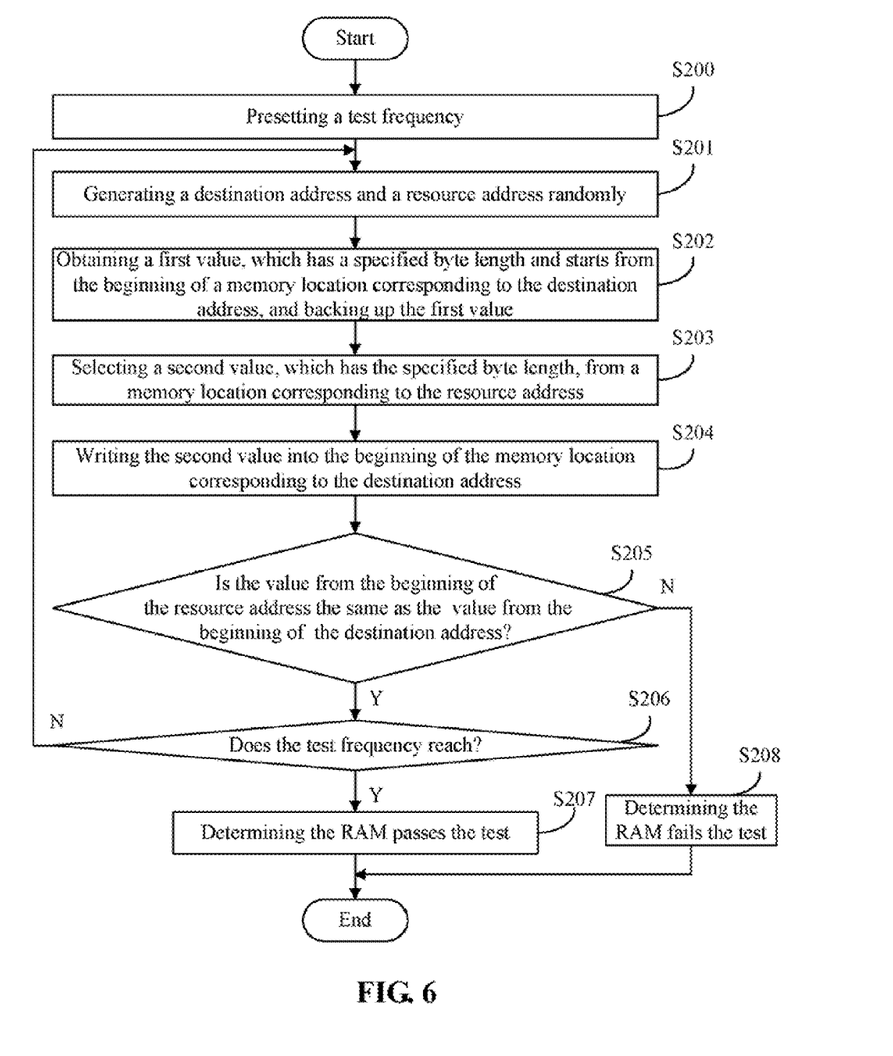
FIG. 6 is a flowchart illustrating one embodiment of a method detailing block S20 of FIG. 2.

FIG. 6 is a flowchart illustrating one embodiment of a method detailing block S20 of FIG. 2, that is the sixth test for the RAM 20. Depending on the embodiment, additional blocks in the flow of FIG. 6 may be added, others removed, and the ordering of the blocks may be changed.

In block S200, a test frequency is preset. In one embodiment, the test frequency may be preset to 5, for example.

In block S201, a destination address and a resource address are generated randomly.

In block S202, a first value from the destination address is obtained and backed up. In one embodiment, the first value has a particular byte length and starts from the beginning of a storage location corresponding to the destination address. The particular byte length may be 4 KB, for example.

In block S203, a second value from the resource address is obtained. In one embodiment, the second has the particular byte length, such as 4 KB, and starts from the beginning of a storage location corresponding to the resource address.

In block S204, the second value is written into the beginning of the storage location corresponding to the destination address.

In block S205, a comparison is made as to whether two values, which have the particular byte length and respectively are from the beginnings of the resource address and the destination address, are the same. If the two value are the same, the flow goes to block S206. Otherwise, the flow goes to block S208 described below.

In block S206, another determination is made as to whether the test frequency has been reached. If the test frequency has been reached, the flow goes to block S207. Otherwise, if the test frequency has not been reached, the flow returns to block S201 described above.

In block S207, the sixth test result is made as to the RAM 20 passes the sixth test.

In block S205, if the two values are not the same, then, in block S208, the sixth test result is made as to the RAM 20 fails the sixth test.

It may be appreciated that, instructions for performing the aforementioned methods May be included in a non-transitory storage medium configured for execution by the processor 10.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method for testing a random-access memory (RAM) in an electronic device having a processor, the processor writing and/or reading values to/from the RAM via a data bus and an address bus of the electronic device, the method comprising:
   (a) performing a write and read test of the RAM by writing random values into storage locations corresponding to physical addresses of the RAM, reading the random values from the storage locations, and comparing the random values, to determine whether the RAM is able to be written and read normally;
   (b) performing a walking 1's test across the data bus by writing first particular values into the storage locations corresponding to the physical addresses of the RAM, reading the first particular values from the storage locations, and comparing the first particular values, wherein only one bit of each first particular value is set to "1", and all other bits is set to "0," to confirm whether each bit location of the data bus is able to hold a 1 value;
   (c) performing a walking 0's test across the data bus by writing second particular values into the storage locations corresponding to the physical addresses of the RAM, reading the second particular values from the storage locations, and comparing the second particular values, wherein only one bit of each second particular value is set to "0" and all other bits is set to "1," to confirm whether each bit location of the data bus is able to hold a 0 value;
   (d) performing a walking 1's test across the address bus by writing random values into storage locations corresponding to first memory addresses of the RAM, reading the random values from the storage locations, and comparing the random values, wherein only one bit of each first memory address is set to "1" and all other bits is set to "0," to confirm whether each bit location of the address bus is able to hold a 1 value;
   (e) performing a walking 0's test across the address bus by writing random values into storage locations corresponding to second memory addresses of the RAM, reading the random values from the storage locations, and comparing the random values, wherein only one bit of each second memory address is set to "0" and all other bits is set to "1," to confirm whether each bit location of the address bus is able to hold a 0 value;
   (f) performing a write and read test to random blocks in the storage locations of the RAM by reading a value which is stored from the beginning of a storage location corresponding to a resource address, writing the value into a storage location corresponding to a destination address from the beginning of the storage location, reading the value from the beginning of the storage location corresponding to the destination address, and comparing the two read values, to determine whether the random blocks in the storage locations of the RAM are able to be write and read normally; and
   (g) outputting a final results of all test steps from (a) to (f) as to whether the RAM is in an operable status or not.

2. The method as described in claim 1, wherein step (a) comprises:

selecting a physical address of the RAM and writing a random value into a storage location corresponding to the selected physical address;

reading a value from the storage location corresponding to the selected physical address;

comparing the written value and the read value; and determining the RAM passes the step (a) upon the condition that the read value is the same as the written value, or determining the RAM fails the step (a) upon the condition that the read value is not the same as the written value.

3. The method as described in claim 2, wherein a bit width of the random value is the same as a word length of the processor.

4. The method as described in claim 1, wherein step (b) comprises:

(1) selecting a physical address of the RAM;

(2) preparing a set of first particular values, a count of the set of the first particular values and a bit width of each first particular value being equal to a word length of the processor, only one bit of each first particular value being set to "1", all other bits being set to "0," and all of the first particular values being different from each other;

(3) writing any one of the first particular values into a storage location corresponding to the selected physical address;

(4) reading a value from the storage location correspond to the selected physical address;

(5) comparing the read value and the written value; and (6) determining the RAM fails the step (b) upon the condition that the read value is not the same as the written value; or (7) repeating from (3) to (6) until all the first particular values are written the into storage location; and (8) determining the RAM passes the step (b) upon the condition that the read value is the same as the written value every time.

5. The method as described in claim 1, wherein step (c) comprises:

(1) selecting a physical address of the RAM;

(2) preparing a set of second particular values, a count of the set of the second particular values and a bit width of each second particular value being equal to a word length of the processor, only one bit of each second particular value being set to "0", all other bits being set to "1," and all of the second particular values being different from each other;

(3) writing any one of the second particular values into a storage location corresponding to the selected physical address;

(4) reading a value from the storage location correspond to the selected physical address;

(5) comparing the read value and the written value; and (6) determining the RAM fails the step (c) upon the condition that the read value is not the same as the written value; or (7) repeating from (3) to (6) until all the second particular values are written into the storage location; and (8) determining the RAM passes the step (c) upon the condition that the read value is the same as the written value every time.

6. The method as described in claim 1, wherein step (d) comprises:

constructing the first memory addresses of the RAM, a count of the constructed first memory addresses being determined according to a physical capacity of the RAM, binary format of the constructed first memory addresses comprising setting only one bit of each constructed first memory addresses to be "1" and all other bits to be "0," and "1" being shifted from the first bit to the "nth" bit of the constructed first memory addresses, wherein "n" is equal to the count of the constructed first memory addresses;

selecting one of the constructed first memory addresses;

writing a random value into a storage location corresponding to the selected constructed first memory address;

reading a value from the storage location corresponding to the selected constructed first memory address;

comparing the read value and the written value;

determining the RAM fails the step (d) upon the condition that the read value is not the same as the written value; or retuning to the selecting step upon the condition that the read value is not the same as the written value; and determining the RAM passes the step (d) upon the condition that all the constructed first memory addresses have been selected, and the read value is the same as the written value every time.

7. The method as described in claim 1, wherein step (e) comprises:

constructing the second memory addresses of the RAM, a count of the constructed second memory addresses being determined according to a physical capacity of the RAM, binary format of the constructed second memory addresses comprising setting only one bit of each constructed second memory addresses to be "0" and all other bits to be "1," and "0" being shifted from the first bit to the "nth" bit of the constructed second memory addresses, wherein "n" is equal to the count of the constructed second memory addresses;

selecting one of the constructed second memory addresses;

writing a random value into a storage location corresponding to the selected constructed second memory address;

reading a value from the storage location corresponding to the selected constructed second memory address;

comparing the read value and the written value;

determining the RAM fails the step (e) upon the condition that the read value is not the same as the written value; or retuning to the selecting step upon the condition that the read value is not the same as the written value; and determining the RAM passes the step (e) upon the condition that all the constructed second memory addresses have been selected, and the read value is the same as the written value every time.

8. The method as described in claim 1, wherein step (f) comprises:

(f1) generating a destination address and a resource address randomly;

(f2) obtaining a first value which has a particular byte length and starts from the beginning of a storage location corresponding to the destination address, and backing up the first value;

(3) obtaining a second value which has the particular byte length and starts from the beginning of a storage location corresponding to the resource address;

(f4) writing the second value into the beginning of the storage location corresponding to the destination address;

(f5) comparing two values which have the particular byte length and respectively are from the beginning of the resource address and the destination address; and (f6) determining the RAM passes the step (f) upon the condition that the two values are the same, or determining the RAM fails the step (f) upon the condition that the two values are not the same.

9. The method as described in claim 8, wherein step (f) further comprises:
presetting a test frequency before (f1); and
determining whether the test frequency has reached after (f5).

10. The method as described in claim 8, wherein the particular byte length is 4 KB.

11. A non-transitory storage medium having stored thereon instructions that, when executed by a processor, causing the processor to perform a method for testing a random-access memory (RAM), the method comprising:
(a) performing a write and read test of the RAM by writing random values into storage locations corresponding to physical addresses of the RAM, reading the random values from the storage locations, and comparing the random values, to determine whether the RAM is able to be written and read normally;
(b) performing a walking 1's test across a data bus of the RAM by writing first particular values into the storage locations corresponding to the physical addresses of the RAM, reading the first particular values from the storage locations, and comparing the first particular values, wherein only one bit of each first particular value is set to "1", and all other bits is set to "0," to confirm whether each bit location of the data bus is able to hold a 1 value;
(c) performing a walking 0's test across the data bus by writing second particular values into the storage locations corresponding to the physical addresses of the RAM, reading the second particular values from the storage locations, and comparing the second particular values, wherein only one bit of each second particular value is set to "0" and all other bits is set to "1," to confirm whether each bit location of the data bus is able to hold a 0 value;
(d) performing a walking 1's test across an address bus of the RAM by writing random values into storage locations corresponding to first memory addresses of the RAM, reading the random values from the storage locations, and comparing the random values, wherein only one bit of each first memory address is set to "1" and all other bits is set to "0," to confirm whether each bit location of the address bus is able to hold a 1 value;
(e) performing a walking 0's test across the address bus by writing random values into storage locations corresponding to second memory addresses of the RAM, reading the random values from the storage locations, and comparing the random values, wherein only one bit of each second memory address is set to "0" and all other bits is set to "1," to confirm whether each bit location of the address bus is able to hold a 0 value;
(f) performing a write and read test to random blocks in the storage locations of the RAM by reading a value which is stored from the beginning of a storage location corresponding to a resource address, writing the value into a storage location corresponding to a destination address from the beginning of the storage location, reading the value from the beginning of the storage location corresponding to the destination address, and comparing the two read values, to determine whether the random blocks in the storage locations of the RAM are able to be write and read normally; and
(g) outputting a final results of all test steps from (a) to (f) as to whether the RAM is in an operable status or not.

12. The non-transitory storage medium as described in claim 11, wherein step (a) comprises:
selecting a physical address of the RAM and writing a random value into a storage location corresponding to the selected physical address;
reading a value from the storage location corresponding to the selected physical address;
comparing the written value and the read value; and
determining the RAM passes the step (a) upon the condition that the read value is the same as the written value, or determining the RAM fails the step (a) upon the condition that the read value is not the same as the written value.

13. The non-transitory storage medium as described in claim 12, wherein a bit width of the random value is the same as a word length of the processor.

14. The non-transitory storage medium as described in claim 11, wherein step (b) comprises:
(1) selecting a physical address of the RAM;
(2) preparing a set of first particular values, a count of the set of the first particular values and a bit width of each first particular value being equal to a word length of the processor, only one bit of each first particular value being set to "1", all other bits being set to "0," and all of the first particular values being different from each other;
(3) writing any one of the first particular values into a storage location corresponding to the selected physical address;
(4) reading a value from the storage location correspond to the selected physical address;
(5) comparing the read value and the written value; and
(6) determining the RAM fails the step (b) upon the condition that the read value is not the same as the written value; or
(7) repeating from (3) to (6) until all the first particular values are written into storage location; and
(8) determining the RAM passes the step (b) upon the condition that the read value is the same as the written value every time.

15. The non-transitory storage medium as described in claim 11, wherein step (c) comprises:
(1) selecting a physical address of the RAM;
(2) preparing a set of second particular values, a count of the set of the second particular values and a bit width of each second particular value being equal to a word length of the processor, only one bit of each second particular value being set to "0", all other bits being set to "1," and all of the second particular values being different from each other;
(3) writing any one of the second particular values into a storage location corresponding to the selected physical address;
(4) reading a value from the storage location correspond to the selected physical address;
(5) comparing the read value and the written value; and
(6) determining the RAM fails the step (c) upon the condition that the read value is not the same as the written value; or
(7) repeating from (3) to (6) until all the second particular values are written into the storage location; and
(8) determining the RAM passes the step (c) upon the condition that the read value is the same as the written value every time.

16. The non-transitory storage medium as described in claim 11, wherein step (d) comprises:
constructing the first memory addresses of the RAM, a count of the constructed first memory addresses being determined according to a physical capacity of the RAM, binary format of the constructed first memory addresses comprising setting only one bit of each constructed first memory addresses to be "1" and all other bits to be "0," and "1" being shifted from the first bit to the "nth" bit of the constructed first memory addresses, wherein "n" is equal to the count of the constructed first memory addresses;

selecting one of the constructed first memory addresses;

writing a random value into a storage location corresponding to the selected constructed first memory address;

reading a value from the storage location corresponding to the selected constructed first memory address;

comparing the read value and the written value;

determining the RAM fails the step (d) upon the condition that the read value is not the same as the written value; or retuning to the selecting step upon the condition that the read value is not the same as the written value; and determining the RAM passes the step (d) upon the condition that all the constructed first memory addresses have been selected, and the read value is the same as the written value every time.

17. The non-transitory storage medium as described in claim 11, wherein step (e) comprises:

constructing the second memory addresses of the RAM, a count of the constructed second memory addresses being determined according to a physical capacity of the RAM, binary format of the constructed second memory addresses comprising setting only one bit of each constructed second memory addresses to be "0" and all other bits to be "1," and "0" being shifted from the first bit to the "nth" bit of the constructed second memory addresses, wherein "n" is equal to the count of the constructed second memory addresses;

selecting one of the constructed second memory addresses;

writing a random value into a storage location corresponding to the selected constructed second memory address;

reading a value from the storage location corresponding to the selected constructed second memory address;

comparing the read value and the written value;

determining the RAM fails the step (e) upon the condition that the read value is not the same as the written value; or retuning to the selecting step upon the condition that the read value is not the same as the written value; and determining the RAM passes the step (e) upon the condition that all the constructed second memory addresses have been selected, and the read value is the same as the written value every time.

18. The non-transitory storage medium as described in claim 11, wherein step (f) comprises:

(f1) generating a destination address and a resource address randomly;

(f2) obtaining a first value which has a particular byte length and starts from the beginning of a storage location corresponding to the destination address, and backing up the first value;

(f3) obtaining a second value which has the particular byte length and starts from the beginning of a storage location corresponding to the resource address;

(f4) writing the second value into the beginning of the storage location corresponding to the destination address;

(f5) comparing two values which have the particular byte length and respectively are from the beginning of the resource address and the destination address; and (f6) determining the RAM passes the step (f) upon the condition that the two values are the same, or determining the RAM fails the step (f) upon the condition that the two values are not the same.

19. The non-transitory storage medium as described in claim 18, wherein step (f) further comprises:

presetting a test frequency before (f1); and determining whether the test frequency has reached after (f5).

20. The non-transitory storage medium as described in claim 18, wherein the particular byte length is 4 KB.

* * * * *